United States Patent [19]

Convertini et al.

[11] 4,049,521
[45] Sept. 20, 1977

[54] CATHODE SPUTTERING METHOD FOR THE MANUFACTURE OF ETCHED STRUCTURES

[75] Inventors: Ursula Convertini, Borstel; Heinz Dimigen, Hamburg; Holger Lüthje, Halstenbek, all of Germany

[73] Assignee: U.S. Philips Corporation, New York, N.Y.

[21] Appl. No.: 693,491

[22] Filed: June 7, 1976

[30] Foreign Application Priority Data

June 13, 1975 Germany .............................. 2526382

[51] Int. Cl.² ............................................. C23C 15/00
[52] U.S. Cl. .......................... 204/192 E; 204/192 EC
[58] Field of Search ...................... 204/192 E, 192 EC

[56] References Cited

U.S. PATENT DOCUMENTS 3,816,198   6/1974   La Combe et al. .................... 156/16

OTHER PUBLICATIONS

G. N. Jackson, "R.F. Sputtering", *Thin Solid Films*, vol. 5, pp. 236-239 (1970).
J. L. Vossen et al., "Back Scattering of Material Emitted from RF-Sputtering Targets", *RCA Review*, vol. 31, pp. 293-305 (1970).

*Primary Examiner*—John H. Mack
*Assistant Examiner*—Aaron Weisstuch
*Attorney, Agent, or Firm*—Frank R. Trifari; Norman N. Spain

[57] ABSTRACT

In usual practice, cathodically etched structures typically show either non-etched parts (strong readsorption of sputtered material) or the etched structure shows strong grooves at the edges of the etching mask (strong back-diffusion of sputtered material). With a variation of the working gas pressure an adjustability of the average free path length of the atoms of the sputtered material and hence the adjustability of the quantity of material redeposited on the basis of back-diffusion is obtained. The working gas pressure can hence be adjusted so that the etching time to remove the readsorbed material and the material deposited again by back-diffusion is locally constant and equal etching rates are obtained for all areas of the structure to be etched.

8 Claims, 2 Drawing Figures

CATHODE SPUTTERING METHOD FOR THE MANUFACTURE OF ETCHED STRUCTURES

The invention relates to a cathode-sputtering method for the manufacture of etched structures in substrates covered with etching masks, in which the etching mask leaves exposed areas of different sizes on the substrate and in which said substrates are arranged on a cathode in a sputtering space and a gas discharge is initiated and maintained between the cathode and an anode.

Such methods are known and are used in thin-layer technology, for example, for the manufacture of integrated magnetic memories, thin-layer resistors, or semiconductor devices.

In these methods—as in the wet-chemical etching processes—the layer to be structured is covered with a mask which in most cases consists of a photolacquer and is manufactured in known manner by a photolithographic process. However, other materials may also be used for masks, for example, titanium or molybdenum, in the case of special etching problems, for example, in producing deep structures having a high accuracy in regard to to size.

A structure produced in a substrate by means of ion etching shows more or less significant characteristic changes as compared with the original profile of the etching mask, which changes are due to a shrinkage of the original profile width of the etching mask and consequently a non-uniformity of the mask etching rate in the immediate proximity of the mask sides. These effects are caused partly because the ions at the area of the mask edges impinge upon the surface of the mask at an oblique angle. It is known that most of the materials examined previously show an increase of the yield of sputtered particles per incident ion with increasing angle of incidence of the ions against the normal to the surface, so that the mask structure experiences an increased disintegration at inclined edges and as a result the structure produced in the substrate is caused to have a profile shrinkage. By the choice of a suitable mask material said profile shrinkage of the structure produced in the substrate can be substantially avoided (compare German Patent Application No. 22 58 297.4-34).

However, in addition to the mask properties, the local homogeneity of the etching rate is decisively influenced by two further effects: by readsorption of the sputtered material and by back-diffusion of sputtered material.

DETAILED DESCRIPTION OF THE INVENTION

Figure 1:
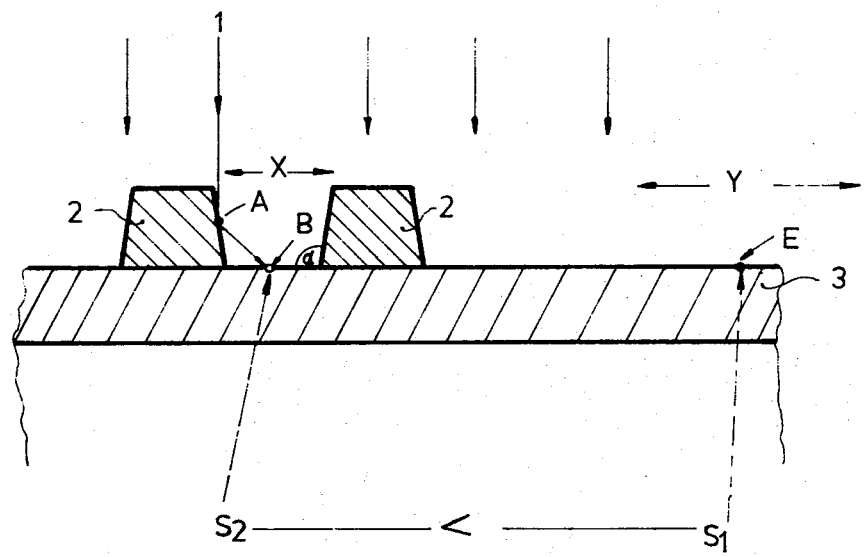
FIG. 1 illustrates the effect of readsorption of suputtered material.

FIG. 1 shows diagrammatically the process of readsorption of sputtered material. A gas ion 1 incident at point A on the side of the mask 2 results in a sputtering of mask material which is deposited on the layer to be etched 3, at areas near the mask, for example, at point B. As a result of this, in certain circumstances the effective etching rate $S_2$ in areas near the mask is considerably reduced as compared with the effective etching rate $S_1$ in areas remote from the mask, for example, at point E.

In the process of back-diffusion, parts (atoms) of sputtered material experience a sudden change of direction with each impact with other particles. As a result in the course of time they described a zig-zag path. The individual, straight, unbent parts of said path are termed "free path lengths". Of course, these are by no means mutually equal; sometimes a particle meets two particles, one after another in a short period of time, and sometimes it traverses a long track without any impact. When the average value is calculated from a large number of the free path lengths, this "average free path length" $\lambda$, the average length of the individual parts of the path of the particle, represents a quantity which is characteristic of the gas and its condition (pressure, temperature). When the pressure of the gas is reduced, the parts of the individual path of the particles and hence the average free path length, are increased; when the gas pressure is increased, they are reduced, and calculation shows that $\lambda$ is inversely proportional to the gas pressure and the density, respectively. When, with an increased working gas pressure, the average free path length $\lambda$ of the atoms of the sputtered material in the sputtering space becomes small as compared with the distance $d$ between substrate and anode, a part of the sputtered material diffuses back on the target and the substrate 3 placed thereon. So on the basis of the diffusion of target material on the substrate and conversely, a reduction of the etching rate is the result which is less pronounced in the immediate proximity of mask sides due to the shadow occurring there.

Figure 2:
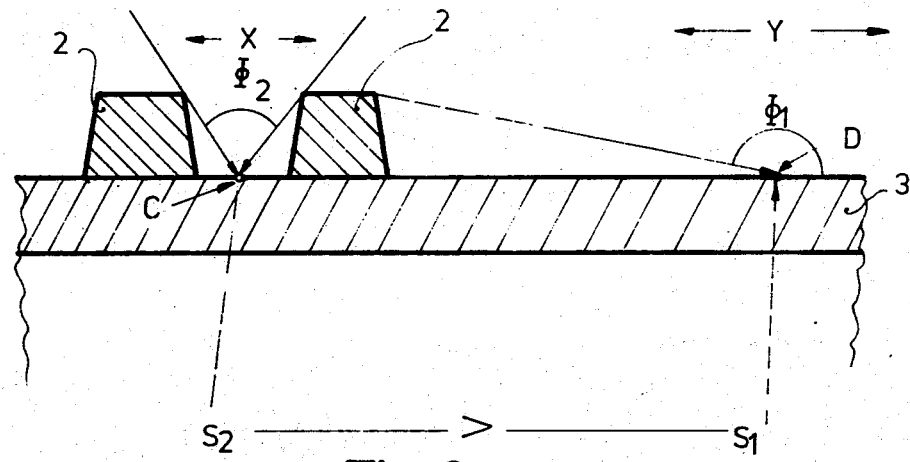
FIG. 2 shows the influence of back-diffusion on the local etching rate.

FIG. 2 shows the influence of back-diffusion on the local etching rate. Whereas point C receives diffused material from the solid angle $\phi_2$, the solid angle $\phi_1$ is determinative at point D. The quantity of back-diffusing material occurring per surface unit hence is smaller at C than at D. Hence the effective etching rate at C is larger than at D.

When, as in FIG. 1, ion etching with perpendicular incidence at the cross-section of a structure as shown is considered under the provision that the back-diffusion of sputtered material is negligible, the removal of the layer in the area denoted by Y occurs at an etching rate $S_1$. Under the same conditions a smaller etching rate $S_2$ is observed at intermediate structure area X since a considerable part of the material sputtered from the side of the mask Z is emitted in the direction of the surface of the layer and must be removed again there by the ions wich are incident at right angles. The number of deposited particles depends on the inclination of the sides and on the thickness of the etching mask, the energy and the density of the ions and the yield of sputtered material assigned to the side angle $\alpha$ while considering the angle distribution of the sputtered solid particles.

These two effects, readsorption and back-diffusion, cooperate in a particularly disadvantageous manner in the manufacture of structures, the topography of which is such that, for example, several very fine, closely adjacent structures are present in one substrate beside larger unstructured areas.

Therefore, in the ion etching of fine structures the following problems present themselves: The structures etched in a substrate show either unevenly etched parts, which is caused by to a strong readsorption of sputtered material—mainly when using ion beam etching devices—or the etched structure shows strong grooves at the edges of the etching mask, which is caused by a strong back-diffusion of sputtered material.

It is the object of the invention to produce very fine structures in any material by means of ion etching in such manner that a homogeneous layer removal occurs independently of the size and geometry of the etching figures, the profile of the etching mask, and the mask material.

According to the invention this object is achieved when the ratio of the distance $d$ between anode and substrate to the average free path length ($\lambda$) of the atoms of the sputtered material, that is $d/\lambda$, is chosen to be larger than 1 but is adjusted so that the etching rates in the small and large areas of the layer to be etched are substantially equally large.

The invention is based on the recognition of the fact that with a variation of the working gas pressure an adjustability of the average free path length $\lambda$ of the atoms of the sputtered material and hence an adjustability of the quantity of the material redeposited because of back-diffusion is obtained. The working gas pressure can be adjusted so that the etching time to remove the readsorbed material and the material deposited again by back-diffusion is locally constant. Thus the same etching rates are obtained for all the areas of the structure to be etched.

Consequently, the quantity of back-diffused material, dependent on the situation in question, becomes adjustable by an equalization of the various etching rates for areas of different dimensions, namely by the choice of the suitable gas pressure, since this determines the average free path length $\lambda$ of the atoms of the sputtered material. Since the quantity of material diffusing back per unit time is determined by the ratio $d/\lambda$ ($d$ = substrate-anod distance) the equalization of the various etching rates $S_1$ and $S_2$ may in principle also be obtained by adjustment distance $d$ for a given gas pressure. Those skilled in the art will have no difficulty in finding the choice of the parameters which are optimum for the process in question. A large amount of back-diffusing material results in the etching rate $S_1$ of the area remote from the mask and denoted in FIG. 1 by Y being considerably more reduced than the etching rate $S_2$ of the area X near the mask. Whereas in the area Y back-diffusing material is deposited from the solid angle $\phi_1$ (see FIG. 2), only a considerably smaller amount determined by the angle $\phi_2$ reaches the area X. With a suitable choice of the gas pressure the influences of readsorption and back-diffusion of sputtered material counter balance each other so that, apart from small deviations, $S_1$ becomes equal to $S_2$.

In this manner control of the initially different etching rates within areas to be structured having different dimensions via control of the intensity of the back-diffusion of sputtered material and hence an equalization of the various etching rates is possible.

The particular advantage achieved by the invention are that very fine structures of any material can be produced by the homogeneous removal of layers by continuous adjustment of the local removal rates. Also, fine etching of figures of very different sizes is possible. The possibility of continuous adjustment of the local etching rates is of particular advantage when etching poly-layer structures since in this case it is particularly important to maintain the unimpaired condition of the layer present immediately below the layer to be etched. Of course, it is also possible to obtain within a given scope defined differences of both signs of the etching rates $S_1$ and $S_2$ by the choice of a suitable gas pressure.

As an example of the invention there is shown the manufacture of a structure which consists of separate etched figures, each having nine interdigitating tracks, 60 $\mu$m long. The width of the parallel extending tracks is 4 $\mu$m with a distance between them of 1.5 $\mu$m. These etched figures were provided with a periodicity of 200 $\mu$m.

The substrate to be structured consisted of a thermally oxidized silicon disc of 38 mm diameter, the surface of which was provided successively with the following layers: 0.16 $\mu$m titanium, 0.15 $\mu$m platinum and 0.62 $\mu$m gold. A 2 $\mu$m thick lacquer structure whose edge inclination was approximately 70° was used as an etching mask. In this case commercially available photolacquer (known as Shipley AZ 135 OH) was used, from which the mask was produced in known manner by a photolithographic process.

The etching of the metal structure on the silicon substrate was carried out in a high frequency-operated cathode sputtering device which was provided with a water-cooled titanium target of 15 cm diameter. The distance between the target and the anode was 21 cm.

Argon was used as an inert working gas. With an argon pressure of $4.8 \times 10^{-3}$ mbar and an ion energy of 1220 eV, a total of 800 sec was necessary to etch the metal layers. With $4.8 \times ^{-3}$ mbar an average free path length $\lambda$ of $\sim$ 1 cm was obtained so that with a distance $d$ between target and anode of 21 cm the ratio $d/\lambda$ was $\sim$ 20. The ion etching conditions described resulted in separate truly etched metal tracks wherein the exposed quartz layer had homogeneous thickness. Comparative experiments with parameters unchanges with the exception of the argon pressure and the ion etching time have given the following results:

1. A reduction of the argon pressure, producing a reduction of the back-diffusion, resulted in unevenly etched metal structures with considerable damage of the 0.4 $\mu$m thick quartz layer in the area remote from the mask (area Y in FIg. 2);

2. An increase of the argon pressure, producing an increase of the back-diffusion, resulted in considerable damage of the quartz layer in the area near the mask (area X in FIG. 2) with a quartz layer not exposed by the metal layer in the area remote from the mask (area Y in FIG. 2).

What is claimed is:

1. A cathode sputtering method for the manufacture of etched structures in substrates covered with etching masks, in which the etching mask leaves exposed areas of different sizes on the substrate and in which said substrates are arranged on a cathode in a sputtering space and a gas discharge is initiated and maintained between the cathode and an anode, characterized in that the ratio of the distance $d$ between anode and substrate to the average free path length of the atoms of the sputtered material, that is $d/\lambda$, is at least 1, and is adjusted so that the etching rates in the small and large areas of the layer to be etched are substantially equally large.

2. A method as claimed in claim 1, characterized in that a rare gas, preferably argon, is used as an inert gas for said gas discharge.

3. A method as claimed in claim 1, characterized in that a photolacquer is used as the material for the etching mask.

4. A method as claimed in claim 1, characterized in that titanium is used as the material for the etching mask.

5. A method as claimed in claim 1, characterized in that molybdenum is used as the material for the etching mask.

6. A method as claimed in claim 1, characterized in that substrates in the form of homogeneous metal layers are etched.

7. A method as claimed in claim 1, characterized in that substrates of several metal layers are etched.

8. A method as claimed in claim 7, characterized in that the metals of the layers are titanium, platinum and gold.

* * * * *

UNITED STATES PATENT AND TRADEMARK OFFICE
CERTIFICATE OF CORRECTION

PATENT NO. : 4,049,521
DATED : September 20, 1977
INVENTOR(S) : URSULA CONVERTINI ET AL It is certified that error appears in the above-identified patent and that said Letters Patent are hereby corrected as shown below:

Column 4, line 56, after "length" insert -- $\lambda$ --.

Signed and Sealed this

Twenty-third Day of May 1978

[SEAL]

Attest:

RUTH C. MASON
Attesting Officer

LUTRELLE F. PARKER
Acting Commissioner of Patents and Trademarks